United States Patent

Kugai

[11] Patent Number: 5,986,280
[45] Date of Patent: *Nov. 16, 1999

[54] PLANAR MAGNETIC SENSOR COMPRISING A SQUID MADE OF SUPERCONDUCTING THIN FILM

[75] Inventor: Hirokazu Kugai, Hyogo, Japan

[73] Assignee: Sumitomo Electric Industries, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/922,679

[22] Filed: Sep. 3, 1997

Related U.S. Application Data

[63] Continuation of application No. 08/677,804, Jul. 10, 1996, abandoned.

[30] Foreign Application Priority Data

Jul. 10, 1995 [JP] Japan .................................. 7-197051
Apr. 5, 1996 [JP] Japan .................................. 8-110302

[51] Int. Cl.[6] .................................................. H01L 29/06
[52] U.S. Cl. ............................. 257/34; 257/30; 257/33; 438/2; 324/248; 505/162
[58] Field of Search .................................. 257/31, 32, 33, 257/34, 35, 36, 39; 324/248; 505/162

[56] References Cited

U.S. PATENT DOCUMENTS 4,801,882  1/1989  Daalmans .............................. 324/248
5,438,036  8/1995  Matsuura et al. ........................ 505/162

FOREIGN PATENT DOCUMENTS 566499  10/1993  European Pat. Off. .
567386  10/1993  European Pat. Off. .

OTHER PUBLICATIONS

Properties of $YBa_2Cu_3O_{7-y}$ Large Washer SQUID, Tanaka et al, Japanese J. Appl. Phys., vol. 32 (1993), pp. 662–664.
Low Noise $YBa_2Cu_3O_{7-\delta}$ Grain Boundary Junction dc SQUIDs, Gross et al, Appl. Phys. Lett. 57 (7), Aug. 13, 1990, pp. 727–729.
dc SQUID Magnetometers From Single Layers of $YBa_2Cu_3O_{7-x}$ Koelle et al, Appl. Phys. Lett. 63 (16), Oct. 18, 1993, pp. 2271–2273.
$YBa_2Cu_3O_x$ Flip–Chip SQUID Magnetometer, Roas et al, Advances in Superconductivity VI, Springer–Verlag, pp. 1119–1122.
Low Noise $YBa_2Cu_3O_{7-x}$–$SrTiO_3$–$YBa_2Cu_3O_{7-x}$ Multilayers for Improved Superconducting Magnetometers, Ludwig et al, Appl. Phys. Lett. 66 (3), Jan. 16, 1995, pp. 373–375.

(List continued on next page.)

*Primary Examiner*—Olik Chaudhuri
*Assistant Examiner*—Douglas A. Wille
*Attorney, Agent, or Firm*—Kerkam, Stowell, Kondracki & Clarke; Dennis P. Clarke

[57] ABSTRACT

A magnetic sensor comprises a SQUID made of a superconducting thin film. The superconducting thin film has a washer pattern and a terminal portion. The washer pattern has a non-square one hole pattern and a pair of slit patterns. The hole pattern has rectangle shape and includes the center of the washer pattern. The slit patterns having a straight shape growing parallel to the long side of the hole pattern, from the outside edge of the washer pattern toward the inside of the washer pattern. This outside edge of the washer pattern is the nearest to the hole pattern. There is an artificial grain boundary in the domain that spacing between the hole pattern and the slit pattern is narrowest. There is no artificial grain boundary in the other domain at all.

10 Claims, 11 Drawing Sheets

OTHER PUBLICATIONS

Low–Noise $YBa_2Cu_3O_7$–$PrBa_2Cu_3O_7$ Multiturn Flux Transformers, Keene et al, Appl. Phys. Lett. 64 (3), Jan. 17, 1994, pp. 366–368.

Effect of Thermal Noise on the Characteristics of a High $T_c$ Superconducting Quantum Interference Device, Enpuku et al, J. Appl. Phys. 73 (11), Jun. 1, 1993, pp. 7929–7934.

Knappe et al, *Cryogenics*, vol. 32, No. 10, "A Planar $YBa_2Cu_3O_7$ Gradiometer at 77 K," pp. 881–884, (Jan. 1992).

Zhang et al, *Applied Physics Letters*, vol. 60, No. 18, "Microwave RF SQUID Integrated into a Planar $YBa_2Cu_3O_7$ Resonator," pp. 2303–2305 (May 1992).

Ludwig et al, *Applied Superconductivity*, vol. 3, No. 7/10, "Multilayer Magnetometers Based on High–$T_c$ SQUIDS," pp. 383–398 (Jul. 1995).

PLANAR MAGNETIC SENSOR COMPRISING A SQUID MADE OF SUPERCONDUCTING THIN FILM

This application is a continuation of patent application Ser. No. 08/677,804 filed Jul. 10, 1996, now abandoned.

BACKGROUND OF THE INVENTION

1. Field of the Invention

The present invention is related to a magnetic sensor comprising a SQUID made of superconducting thin film.

2. Description of Related Art

A SQUID is a fundamental device that uses technology for profit of superconductivity. SQUID can be used as a magnetic sensor having very high sensitivity.

Generally, a SQUID is produced by patterning a superconducting thin film. A pattern of superconducting thin film of the SQUID includes a washer pattern and a pair of terminal portions, and at least one weak link exists in the washer pattern. Superconducting current spreads in the washer pattern. Output voltage of the SQUID changes according to intensity of magnetic flux passing inside the washer pattern.

Actually, a shape of the washer pattern is generally quadrangle. There is a hole pattern in the center of the quadrangle pattern. The terminal portions grow from a pair side of the quadrangle pattern toward the outside. A pair of slit patterns exist on the other sides without the terminal portions. The weak links are located between the hole pattern and the slit patterns.

Various kinds of developments concerning the pattern of superconducting thin film of SQUID have been proposed.

There is a proposal in *Jpn. J. Appl. Phys.*, Vol.32, p.662–664 (1993) concerning a SQUID that has a large outside diameter. On this SQUID, line width of the washer pattern is very large and focusing effect of magnetic flux occurs therein. As a result, density of magnetic flux passing inside of the SQUID becomes high, and sensitivity as a magnetic sensor becomes high.

By the way, an individual SQUID can be used as a magnetic sensor. However, actually, there are many cases that SQUID is used with a flux transformer. There is a proposal in *Appl. Phys. Lett.*, Vol. 66, p.373–375 (1995). The flux transformer can be produced as a patterned superconducting thin film, too. Because of use of the flux transformer, sensitivity as magnetic sensor becomes high and physical layout of a magnetic sensor becomes easy. A detection object of a SQUID is magnetic flux passing inside of the SQUID. At the same time, said slit patterns to form weak links on the washer pattern opens toward outside of the SQUID at their ends. Therefore, some of magnetic flux that has been taken by the SQUID is leaked out through the slit pattern.

There is a proposal in *Appl. Phys. Lett.*, Vol. 57, p.727–729 (1990) concerning this point. According to the document, one end of the hole pattern is enlarged and weak links are arranged outside of the washer pattern. When the flux transformer is combined with this SQUID, the weak links are located outside of the input coil. As a result, leak of magnetic flux is reduced.

There is other proposal in *Appl. Phys. Lett.*, Vol. 63, p.2271–2273 (1993) concerning the same subject. According to the document, shape of the hole pattern becomes a rectangle and slit patterns are shortened. As a result, leak of magnetic flux is reduced. However, when the hole pattern becomes large, another problem occurs. When the area of the hole pattern increases, effective magnetic flux capture area ($A_{eff}$) becomes large. At the same time, inductance of the SQUID becomes high. As a result, magnetic flux resolution of the SQUID falls down and total performance of the SQUID becomes low.

There is a proposal in *Advances in Superconductivity VI* Springer-Verlag, p.1119–1122 concerning this point. The hole pattern is formed as a thin and long rectangle. Degradation of magnetic flux resolution is supplemented.

There are other proposals in *Jpn. J. Appl. Phys.*, Vol. 32, p. 662–664 (1993) and *Appl. Phys. Lett.*, Vol. 63, p. 366–368. According to the documents, slit patterns are covered by a superconducting thin film cover insulated from a SQUID and leak of magnetic flux decreases. Furthermore a part of the hole pattern is covered with the superconducting thin film cover and output voltage ($V_{pp}$) rises.

There is another proposal in *J. Appl. Phys.*, Vol. 73, No.11, p. 7929–7934 (1993). According to the document, a damping resistance is connected in parallel to the inductance of the SQUID and output voltage ($V_{pp}$) of SQUID becomes high.

Furthermore, there is another subject concerning a magnetic sensor that it is very difficult to form a weak link by only patterning a superconducting thin film. An artificial grain boundary can be formed by way of deposition of an oxide superconducting thin film on a substrate having step. An artificial grain boundary can be made by even a method to use bi-crystal substrate or by bi-epitaxial growth. Weak link of artificial grain boundary is mentioned in *Jpn. J. Appl. Phys.*, Vol. 32, p. 662–664 (1993). According to the document, an artificial grain boundary is formed in a straight line.

SUMMARY OF THE INVENTION

The present invention succeeds to various kinds of technical subjects as the above. The purpose of the present invention is more enhancement of performance of a magnetic sensor.

A magnetic sensor comprising a SQUID formed of a superconducting thin film is provided by the present invention.

The magnetic sensor of the present invention is characterized in that pattern of the superconducting thin film. In the SQUID, superconducting thin film has a washer pattern and a terminal portion and the washer pattern includes a hole pattern and a slit pattern. The hole pattern has a rectangle shape. The slit patterns grow from the side nearest to the hole pattern and extend to inside of the washer pattern. The slit patterns are parallel to long sides of the hole pattern.

Preferably, the magnetic sensor of the present invention is formed of an oxide superconducting thin film. Some kinds of oxide superconducting materials have high superconducting critical temperature. Therefore, oxide superconducting materials of this kind can be used with a simple cooling device.

At the same time, the magnetic sensor of the present invention is characterized in configuration of the weak links. In a weak link of SQUID, duct of superconduction current must be narrow to the limit. It is very difficult to form an effective weak link by only patterning of a superconducting thin film. Then, an artificial grain boundary is formed on the domain that the hole pattern and the slit pattern is the nearest by. However, an artificial grain boundary formed on other area of the superconducting thin film on the washer pattern is a noise source. When noise occurs, performance of the SQUID falls down. In the magnetic sensor of the present invention, the artificial grain boundary is formed only in the area for the weak links. There is some manufacturing method for an artificial grain boundary.

It is one preferable method to deposit a superconducting thin film on a substrate with step formed beforehand. This method is easier than a method to use a bi-crystal substrate and has more little manufacturing process numbers than a bi-epitaxial method.

Preferably, in the magnetic sensor mentioned above, long side of the hole pattern has more than 5 times length of the short side. Because, enough effective magnetic flux capture area cannot be provided in case of less than 5 times the length of the short side thereof.

Preferably, a size of the washer pattern is not less than 10 mm sq. and does not exceed 200 mm sq. when it was considered as a square. In other words, "mm sq." means "square root of area of a domain surrounded by contour of the washer pattern". When the washer pattern becomes larger, magnetic flux capture area becomes large. But, when this value exceeds 200 mm, quality of an oxide superconducting thin film itself becomes low. In case that quality of an oxide superconducting thin film doesn't deteriorate, the SQUID can be made larger than 200 mm sq.

The magnetic sensor of the present invention can be put on additional products chosen among a flux transformer, a damping resistance and a superconducting thin film cover voluntarily. Each additional equipment improves the performance of the magnetic sensor as below.

In the magnetic sensor with flux transformer, duplication area of input coil and slit pattern becomes smaller. Therefore, coupling coefficient "α" between the SQUID and the flux transformer is improved. However, magnetic flux is still left out through the slit patterns. Accordingly, a leak of magnetic flux is restrained when superconducting thin film cover covering slit pattern is equipped. Furthermore, when the superconducting thin film covers the hole pattern partly, the output voltage ($V_{pp}$) of the SQUID becomes higher. A damping resistance should be connected to the SQUID in parallel to the inductance of the SQUID. When the SQUID is equipped with the damping resistance, the output voltage ($V_{pp}$) becomes higher. Furthermore, when the damping resistance is made of a metal thin film, preferably, thin film of Au and / or Ag gets between the metal thin film and the superconducting thin film. Because, acidity of metal thin film becomes stronger, and, the contact resistance becomes low.

DESCRIPTION OF THE PREFERRED EMBODIMENTS

Figure 1A:
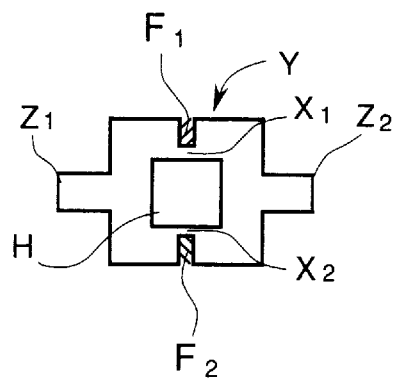
FIGS. 1A to 1F are plan views that show patterns of superconducting thin film of SQUIDs in prior art.

Known patterns of superconducting thin film of conventional SQUID are shown in FIGS. 1A to 1F. A pattern shown in FIG. 1A is the most fundamental pattern. This pattern has one washer pattern Y and a pair of terminal portions Z1, Z2. Configuration of the washer pattern Y is quadrangle and there is a hole pattern H in the center of washer pattern Y. The terminal portions Z1, Z2 are connected to a pair side of the washer pattern Y and extend to outside. A pair of slit patterns F1, F2 are formed on other sides of the washer pattern Y that are not connected to the terminal portions. The weak links X1, X2 are formed between the hole pattern H and the slit patterns F1, F2.

Figure 1B:
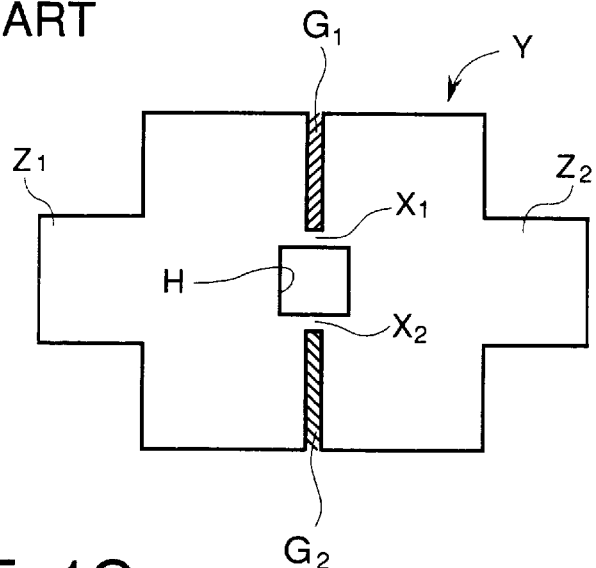

The pattern shown in the FIG. 1B is mentioned in *Jpn. J. Appl. Phys.*, Vol. 32, p. 662–664 (1993). In comparison with the pattern shown in the FIG. 1A, the outer dimension of the washer pattern Y is larger, the width of the line is very wide and the slit patterns G1, G2 are longer. Weak links X1, X2 are formed between the ends of slit patterns G1, G2 and the hole pattern H. On the wide washer pattern of this SQUID, focusing effect of magnetic flux occurs and density of magnetic flux passing inside of the hole pattern becomes high.

By the way, only a SQUID can be used as a magnetic sensor. But, actually, there are many cases that a SQUID is used with flux transformer.

Figure 2A:
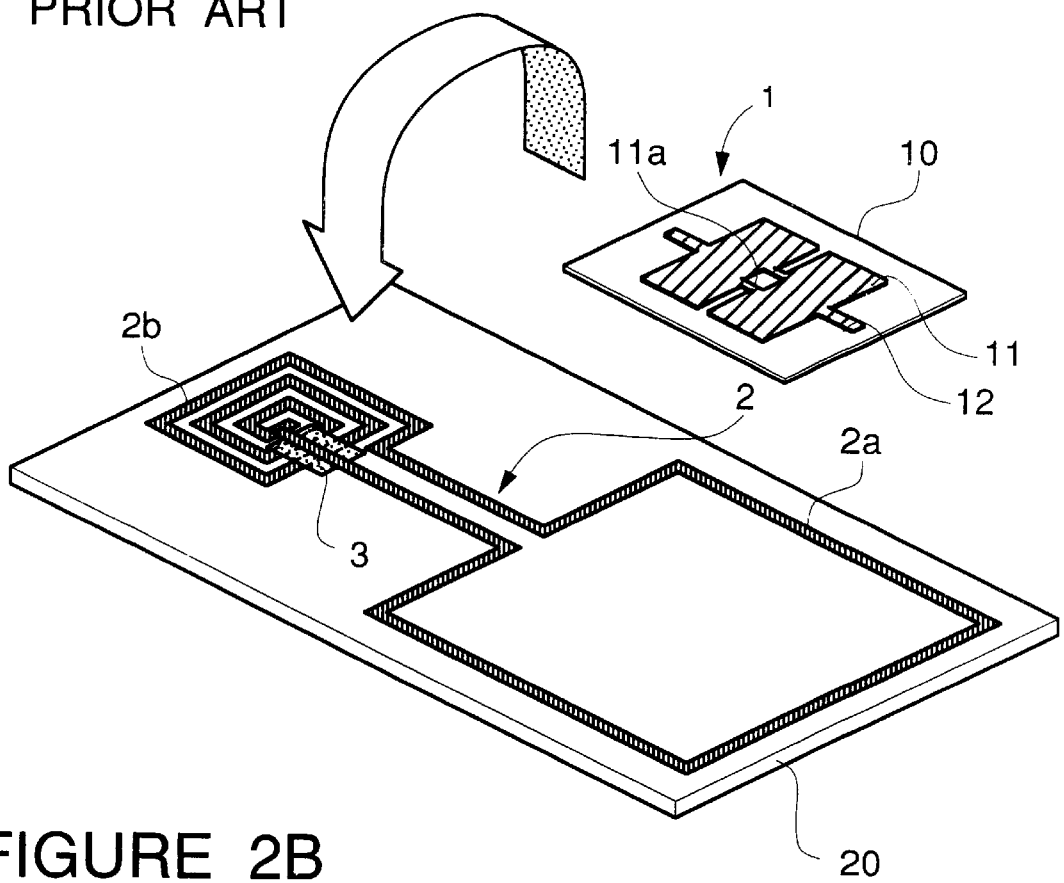
FIG. 2A and FIG. 2B are bird's eye views that show structure of conventional magnetic sensors with a SQUID and a magnetic flux transformer.

A magnetic sensor with a flux transformer is mentioned in *Appl. Phys. Lett.*, Vol. 66, p.373–375 (1995). A magnetic sensor with a flux transformer shown in FIG. 2A comprises a first substrate 10 and a second substrate 20.

A SQUID 1 appears on the first substrate 10 and a flux transformer 2 appears on the second substrate 20. The SQUID 1 comprises one washer pattern 11 including a couple of weak links 11a and a couple of terminal portions 12 grow from the washer pattern 11.

The flux transformer 2 comprises a pickup coil 2a and an input coil 2b that are connected mutually. Winding number of the pickup coil 2a is 1 and winding numbers of the input coil 2b is plural. Furthermore, the flux transformer comprises a junction line that is put on an isolating layer 3 which stays on the input coil 2b and connect one end of the pickup coil 2a to the central end of input coil 2b. The flux transformer is also formed of a superconducting thin film like the SQUID.

Figure 2B:
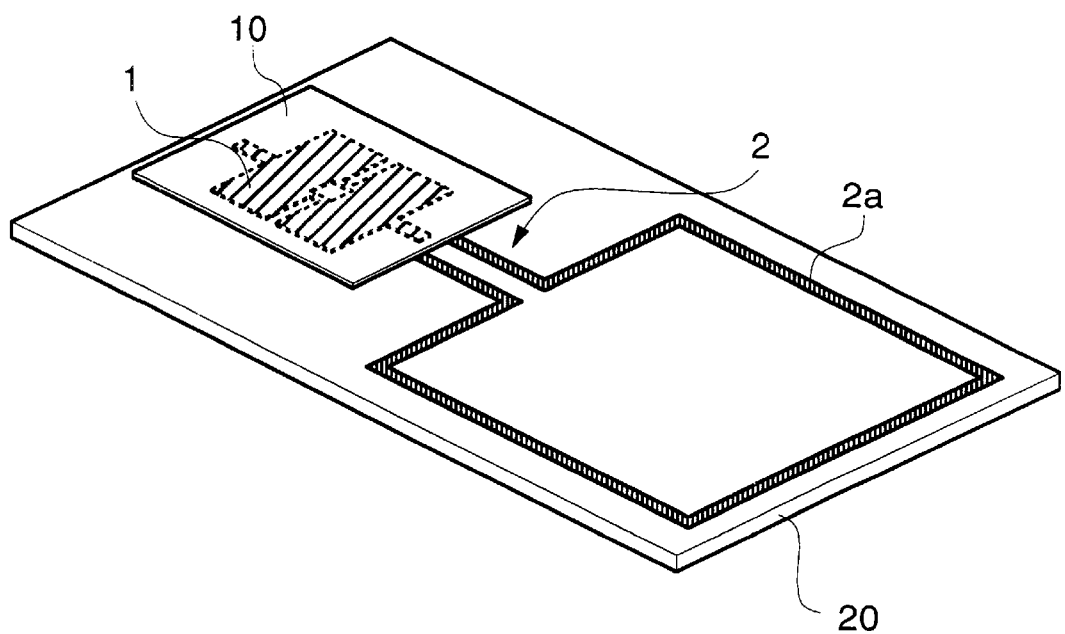

As shown in FIG. 2B, a magnetic sensor can be completed by coupling the first substrate 10 and the second substrate 20. The SQUID and the flux transformer are insulated each other with non-conductive adhesion material or a distance piece. In this magnetic sensor, magnetic flux is detected by the pickup coil 2a and handed from the input coil 2b to the SQUID 1.

Figure 3:
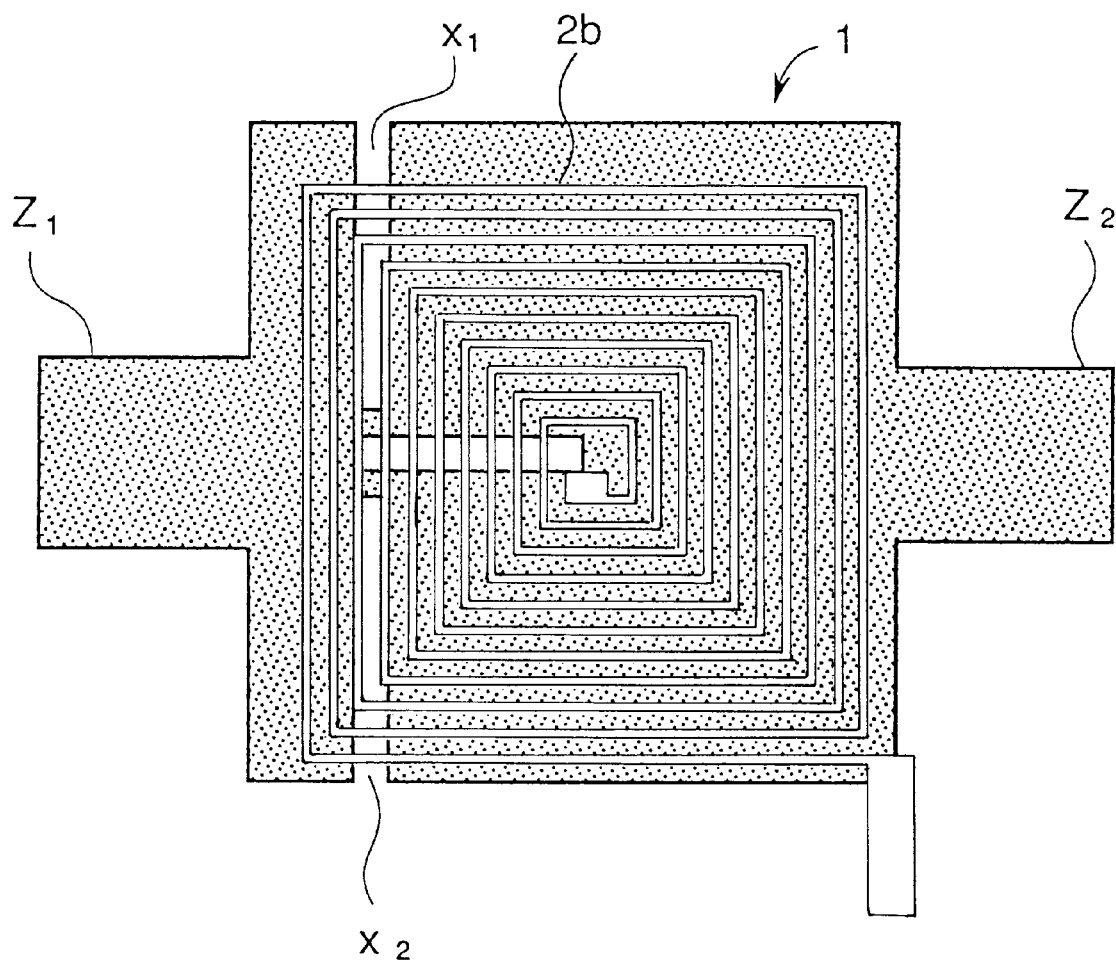
FIG. 3 is a plan view that shows magnified SQUID neighborhood of conventional configuration of magnetic sensor.

A magnified location relationship between the SQUID and the input coil 2b is shown in FIG. 3. The SQUID 1 shown in the FIG. 3 has the same pattern as shown in the FIG. 1E, but the crossover of the flux transformer and the isolating layer are omitted for easy reading. As shown in FIG. 3, equal location is occupied by the center of the input coil and the center of the SQUID 1. One ends of the slit patterns G1, G2 get into inside of the input coil 2b and the other ends of the slit patterns G1, G2 open toward outside of the washer pattern. Accordingly, magnetic flux that had to handed to the hole pattern of the SQUID is left out through the slit patterns G1, G2 partly. As the result, the performance as a magnetic sensor becomes low.

Figure 1C:
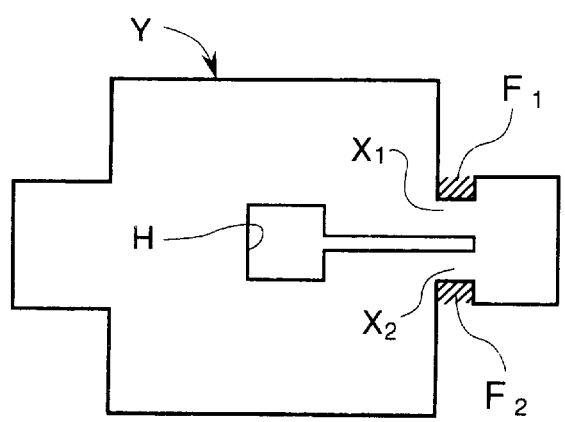

Another pattern shown in FIG. 1C was suggested in *Appl. Phys. Lett.*, Vol. 57, p.727–729 (1990).

As for this pattern, a part of the hole pattern H is extended into the terminal portion and the slit patterns F 1, F 2 grow from the root of the terminal portion and is located in outside of the washer pattern Y. Accordingly, the weak links are located in outer side of the washer pattern Y. When a flux transformer is combined with this SQUID, the slit pattern F1, F2 is located outside of the input coil. Accordingly, a leak of magnetic flux from the slit patterns becomes low.

Figure 1D:
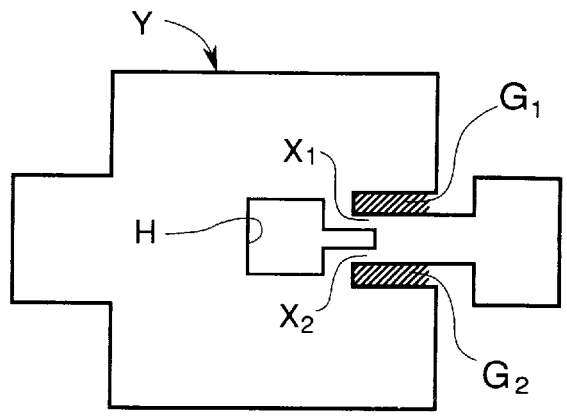

A pattern shown in FIG. 1D is mentioned in *Appl. Phys. Lett.*, Vol. 63, p.2271–2273 (1993). In this pattern, a pair of slit patterns G 1, G 2 are both formed on one side of the washer pattern Y and the hole pattern H is extended toward the slit patterns G1 and G2. Accordingly, the slit patterns G1, G2 become shorter and leak of magnetic flux from slit pattern becomes fewer.

In the patterns shown in the FIG. 1C and 1D, while the hole pattern H becomes large, effective magnetic flux capture area ($A_{eff}$) of SQUID becomes large too. But, at the same time, inductance of SQUID also becomes large. Accordingly, magnetic flux resolution as a magnetic sensor becomes low.

Figure 1E:
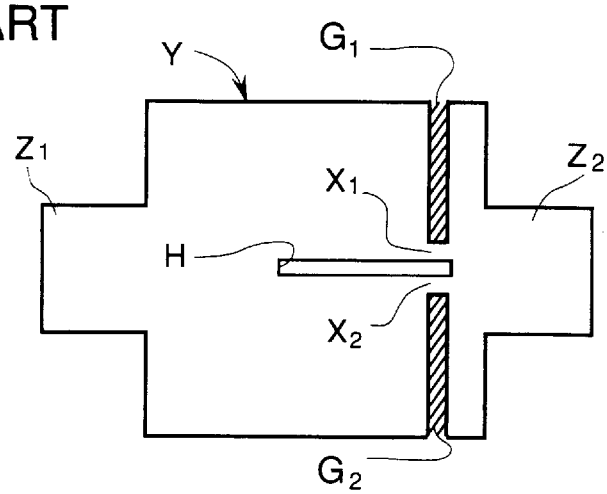

A pattern of SQUID shown in FIG. 1E is mentioned in *Advances in Superconductivity VI*, Springer-Verlag, p. 1119–1122. A hole pattern H of this pattern has a long and narrow rectangle shape and has no square division. Accordingly, gradation of magnetic flux resolution is supplemented.

Figure 1F:
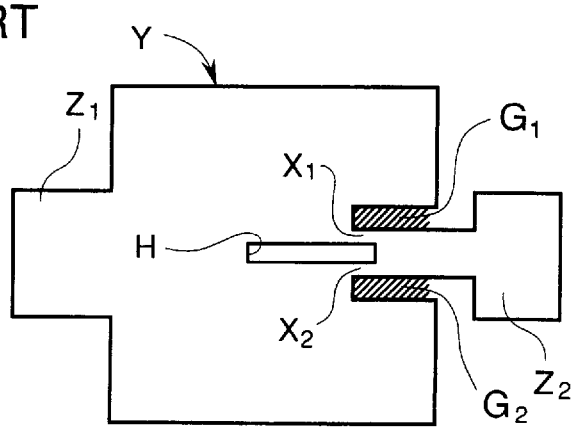

A pattern shown in FIG. 1F is mentioned in *Appl. Phys. Lett.*, Vol. 66, p.373–375 (1995). A hole pattern H of this pattern has a long and narrow rectangle shape. The slit patterns have a straight shape and are parallel to the long side of the hole pattern. Accordingly, area of slit pattern becomes small.

In any kinds of SQUID shown above, it is difficult to form a weak link X1, X2 by only patterning of a superconducting thin film. When material of superconducting thin film is oxide superconducting compound, an artificial grain boundary can be utilized for forming a weak link.

Figure 5:
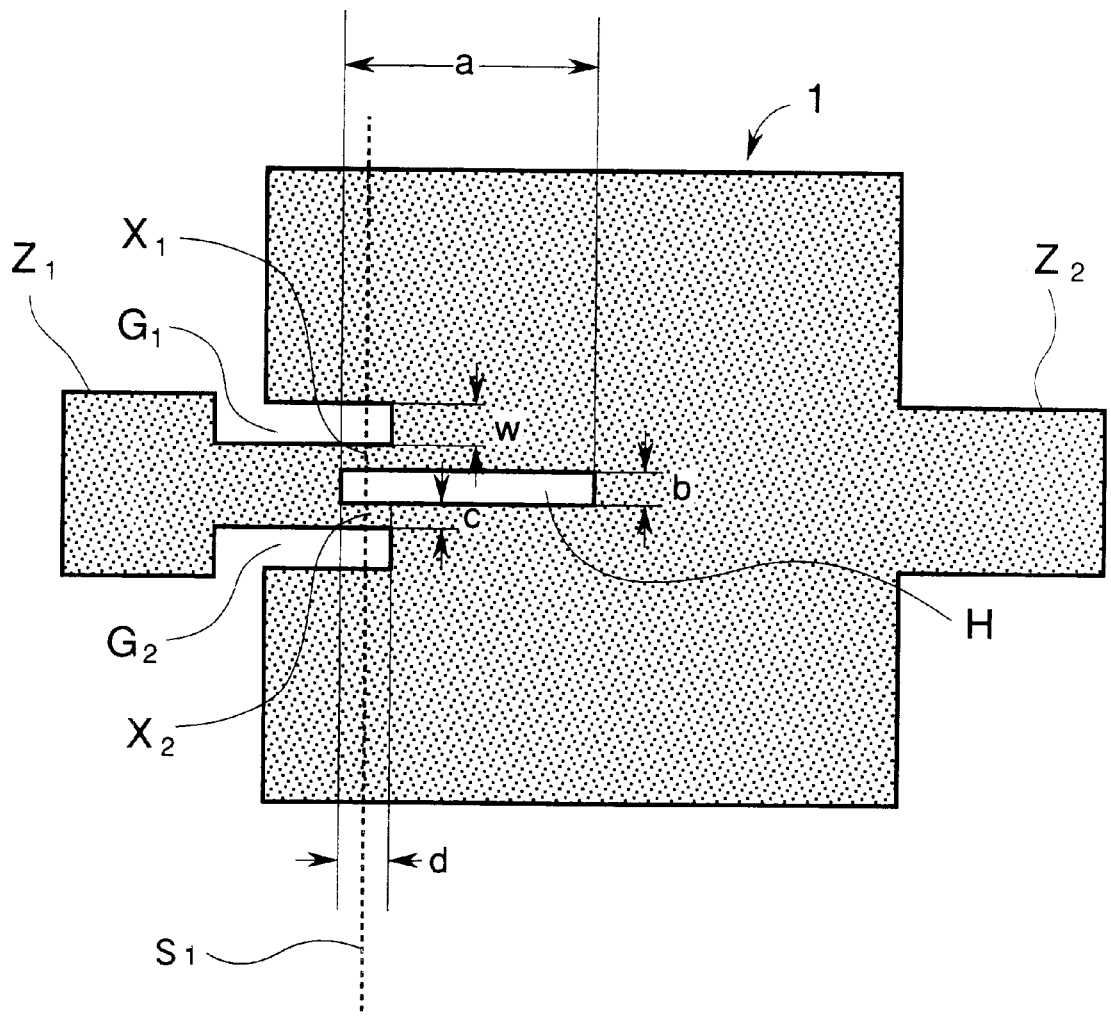
FIG. 5 is a plan view that shows a framing of comparing sample equivalent to FIG. 4A.

A weak link with an artificial grain boundary is mentioned in *Appl. Phys. Lett.*, Vol. 66, p.373–375 (1995). The artificial grain boundary has a straight shape as shown in FIG. 5.

Embodiment 1

A pattern of superconducting thin film of a SQUID that is a part of a magnetic sensor which is embodiment of the present invention is shown by FIG. 4 A.

As same as conventional SQUIDs, this pattern comprises a washer pattern Y and a pair of terminal portions Z1, Z2. However, the hole pattern H has a thin rectangle shape and the slit patterns G1, G2 are parallel to long side of the hole pattern H.

Figure 4A:
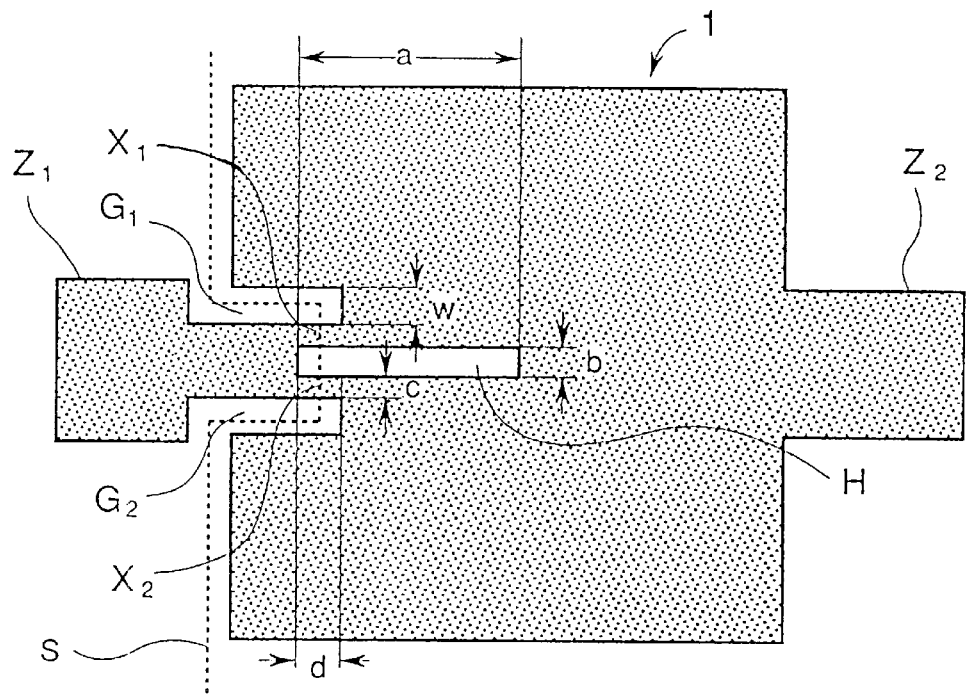
FIG. 4A is a plan view that shows a pattern of the superconducting thin film of the SQUID showing characteristic of magnetic sensor of the present invention.

Configuration of step of the substrate is shown by dotted line S in the FIG. 4A. An artificial grain boundary is formed in oxide superconducting thin film deposited on this step. This artificial grain boundary works as a weak link type Josephson junction. Because the artificial grain boundary is formed in a folded shape as shown by the dotted line S, no artificial grain boundary is formed on other domain of the superconducting thin film.

This oxide superconducting thin film forming the SQUID can be made of $Y_1Ba_2Cu_3O_{7-x}$ deposited by laser ablation method for example. $SrTiO_3$ single-crystal plate can be used as a substrate. Other dimensions of this SQUID are shown in Table 1 as below.

TABLE 1

| Outer dimension of the washer pattern | 2 × 2 | (mm × mm) |
| Dimension of the hole pattern b × a | 8 × 200 | ($\mu$m × $\mu$m) |
| Width of the weak link c | 5 | ($\mu$m) |
| Width of the slit pattern w | 8 | ($\mu$m) |
| Length of the domain between the hole pattern and the slit pattern d | 30 | ($\mu$m) |

At the same time, another sample has been prepared for comparing. This comparing sample was made by same process as the above embodiment, however, the step has a straight shape as shown in FIG. 5. Other dimensions of the comparing sample is same as the embodiment 1. Concerning the embodiment 1 and the comparing sample, magnetic flux resolution at 77 K was measured. Measurement result are shown in Table 2 together.

TABLE 2

| Sample | Magnetic flux resolution at 10 Hz ($\mu\phi_0 \cdot Hz^{-1/2}$) |
|---|---|
| Embodiment | 50 |
| Comparing sample | 60 |

As for comparing sample including unnecessary artificial grain boundary, magnetic flux resolution is low as understood from measurement result in the Table 2. Because, unnecessary artificial grain boundary causes generation of noise.

Embodiment 2

Relationship between a shape of the hole pattern and a performance of the SQUID was examined in this embodiment. Dimensions of produced SQUIDs as embodiments (sample No.5 and No.6) are shown in Table 3 and Table 4. Dimensions not shown in the tables are the same as the embodiment 1. Concerning each sample, effective magnetic flux capture area ($A_{eff}$) and output voltage ($V_{pp}$) at 77 K was measured. The measurement results are shown in Table 3 and Table 4 together.

TABLE 3

| Sample Number | | 1 | 2 | 3 |
|---|---|---|---|---|
| Outer dimension of the washer pattern | (mm × mm) | 2 × 2 | 2 × 2 | 2 × 2 |
| Dimension of the hole pattern b × a | (μm × μm) | 8 × 80 | 8 × 100 | 8 × 200 |
| Width of the weak link c | (μm) | 5 | 5 | 5 |
| Width of the slit pattern w | (μm) | 8 | 8 | 8 |
| Length of the domain between the hole pattern and the slit pattern d | (μm) | 20 | 20 | 20 |
| Effective magnetic flux capture area | (mm²) | 0.035 | 0.045 | 0.09 |
| Output voltage "$V_{pp}$" | (μV) | 11 | 9 | 5 |

TABLE 4

| Sample Number | | 4 | 5 | 6 |
|---|---|---|---|---|
| Outer dimension of the washer pattern | (mm × mm) | 2 × 2 | 2 × 2 | 2 × 2 |
| Dimension of the hole pattern b × a | (μm × μm) | 8 × 300 | 8 × 30 | 8 × 40 |
| Width of the weak link c | (μm) | 5 | 5 | 5 |
| Width of the slit pattern w | (μm) | 8 | 8 | 8 |
| Length of the domain between the hole pattern and the slit pattern d | (μm) | 20 | 20 | 20 |
| Effective magnetic flux capture area | (mm²) | 0.13 | 0.015 | 0.02 |
| Output voltage "$V_{pp}$" | (μV) | 4 | 15 | 14 |

For comparing, SQUID having the pattern shown in FIG. 1B was produced. This SQUID was measured its effective magnetic flux capture area ($A_{eff}$) and output voltage ($V_{pp}$) at 77 K as a sample with number 0. The measurement result of comparing sample is shown in Table 5.

TABLE 5

| Sample Number | | 0 |
|---|---|---|
| Outer dimension of the washer pattern | (mm × mm) | 0 |
| Dimension of the hole pattern b × a | (μm × μm) | 25 × 25 |
| Width of the weak link c | (μm) | 5 |
| Width of the slit pattern w | (μm) | 8 |
| Length of the domain between the hole pattern and the slit pattern d | (μm) | — |
| Effective magnetic flux capture area | (mm²) | 0.018 |
| Output voltage "$V_{pp}$" | (μV) | 13 |

When measurement results are compared, it is appreciated desirable that the long side of the hole pattern is more than 5 times the length of the short side.

Embodiment 3

Figure 4B:
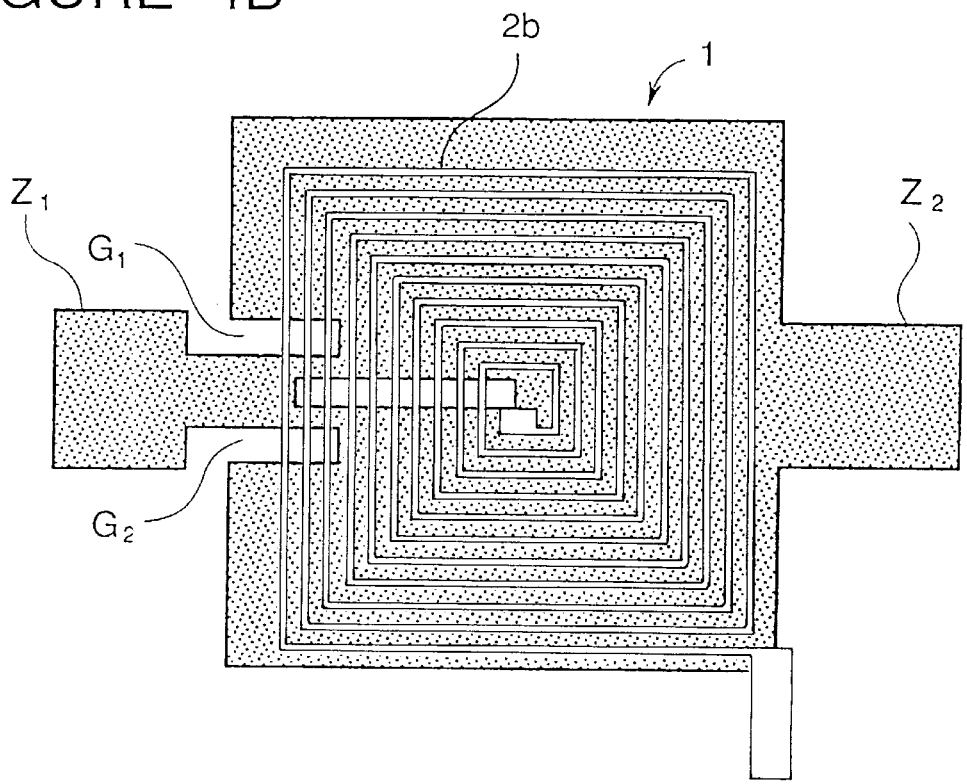
FIG. 4B is a plan view that shows a location relationship with the pattern shown in FIG. 4A and the input coil of superconducting thin film.

The flux transformer that comprises an input coil having a shape shown in FIG. 4B was produced. Material of this flux transformer is the same as the SQUID produced in the embodiment 1 and the embodiment 2. The isolating layer was formed of $SrTiO_3$ thin film. Other dimensions of this flux transformer are shown in Table 6.

TABLE 6

| Number of turns | | 20 |
|---|---|---|
| Line width | (μm) | 20 |
| Line space | (μm) | 10 |
| Outer dimension | (mm × mm) | 20 × 20 |
| Line width | (mm) | 4 |
| Pickup area "Ap" | (mm²) | 240 |
| Inductance "Lp" | (nH) | 23 |

*Input coil

This flux transformer was equipped to the SQUID produced in the embodiment 2. For comparing, the same flux transformer was equipped to a SQUID having a shape shown in the FIG. 3. The area where the slit pattern and input coil conflicts with in each magnetic sensor is shown in the Table 7.

TABLE 7

| Sample Number | Overlapping area (μm²) |
|---|---|
| 1 | 8560 |
| 2 | 8240 |
| 3 | 6640 |
| 4 | 5040 |

As shown in the Table 7, according to the present invention, the overlap area is clearly smaller than that of the comparing sample. Accordingly, leak of magnetic flux through the slit pattern becomes fewer. As a result, coupling coefficient "α" of the flux transformer is improved.

Figure 6A:
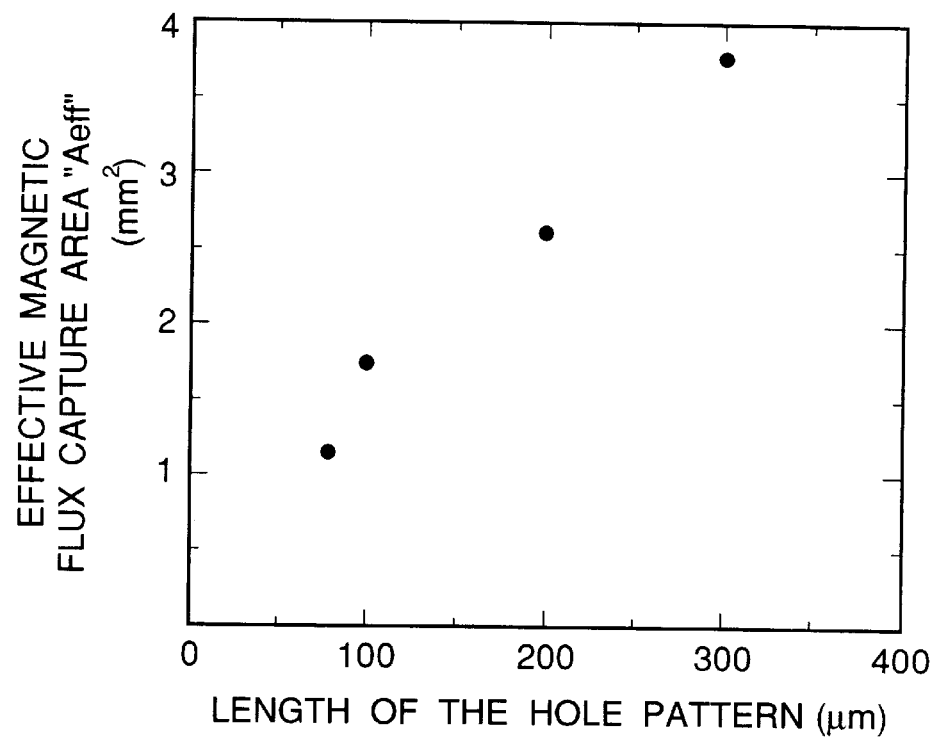
FIG. 6A and FIG. 6B are graphs that show effective magnetic flux capture area of SQUID or coupling coefficient "α" which are measurement result of the embodiment and the comparing example.
Figure 6B:
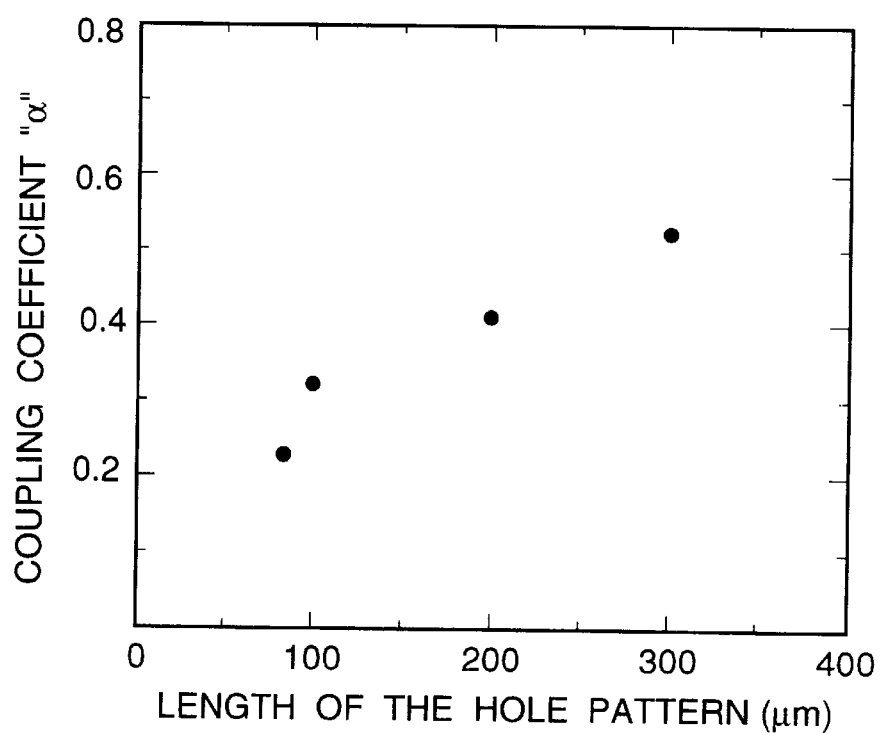

As shown in the FIG. 6A, length of the hole pattern becomes long, and effective magnetic flux capture area "$A_{eff}$" is larger. Lap of slit pattern and input coil is small, and effective magnetic flux capture area is larger. However, when the hole pattern becomes long, inductance of SQUID becomes large. The result that coupling coefficient between the input coil and the SQUID was calculated is shown in FIG. 6B. When hole pattern became long, it was identified that coupling coefficient "α" became high.

Embodiment 4

Figure 7A:
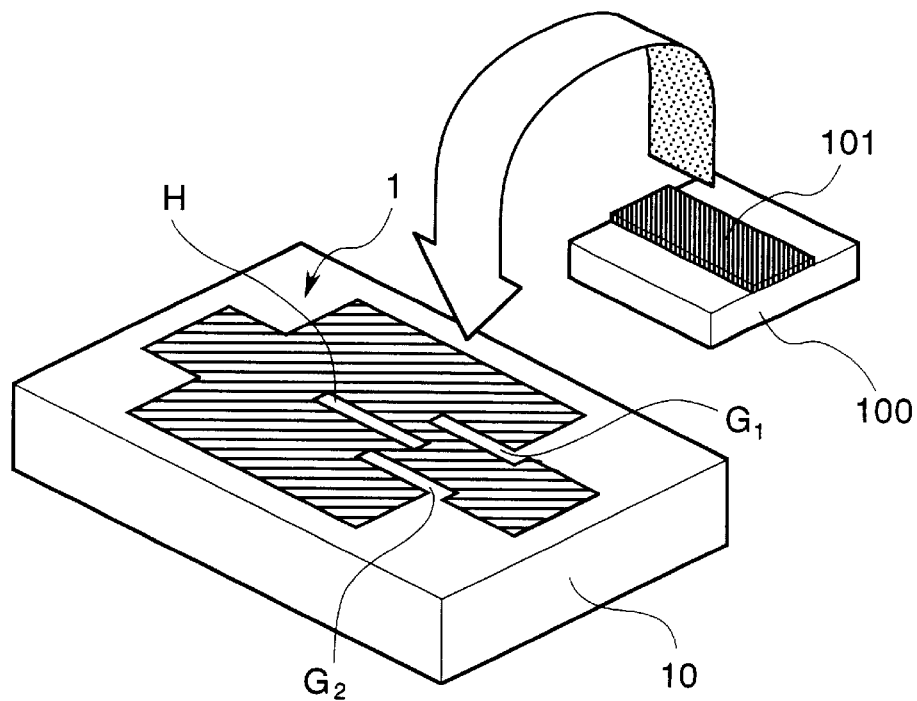
FIG. 7A is a bird's eye view that shows a superconducting thin film cover mounted on a SQUID.

Efficiency of the superconducting thin film cover was examined. Superconducting thin film cover shown in FIG. 7 A was produced. This superconducting thin film cover is made of $Y_1Ba_2Cu_3O_{7-x}$ thin film 101 on deposited a substrate of 1 mm×5 mm. This substrate 100 was coupled with the substrate of SQUID of the embodiment 1 by non-conductive adhesion material. The SQUID and the superconducting thin film cover are insulated mutually.

Figure 7B:
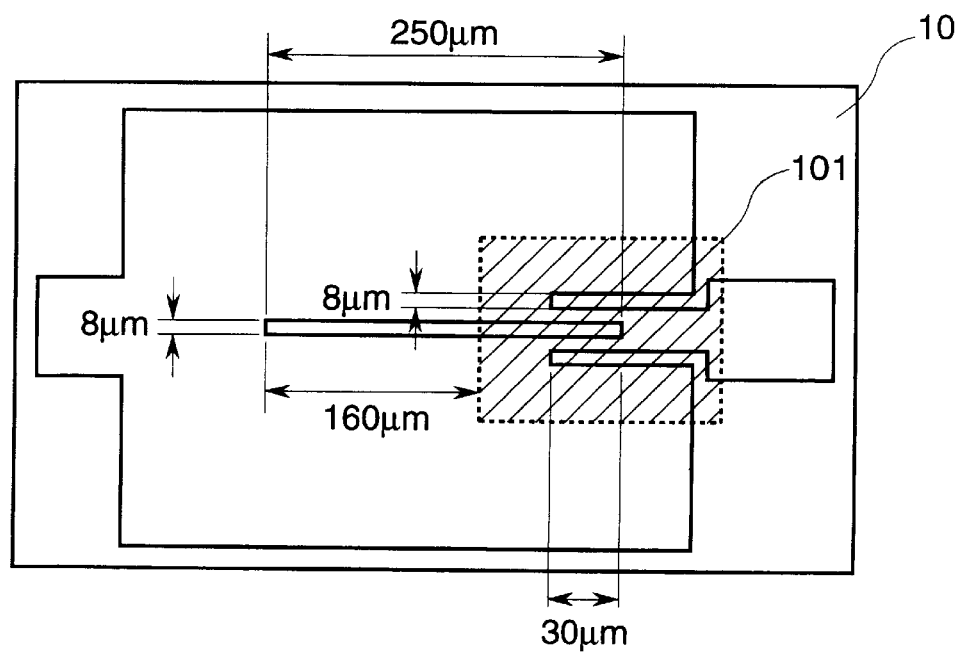
FIG. 7B is a plan view that shows the same object as the FIG. 7A.

Slit patterns G1, G2 and a part of the hole pattern of SQUID were covered by this superconducting thin film as shown in FIG. 7B. The hole pattern was shortened substantially and its substantial length of hole pattern became 160 μm. Concerning the SQUID with the superconducting thin film cover and the SQUID only (without the thin film cover), effective magnetic flux capture area ($A_{eff}$) and output voltage ($V_{pp}$) at 77 K were measured. Measurement result is shown in Table 8.

Furthermore, for comparing, SQUID which has a hole pattern having length of 160 μm was prepared. Other dimensions were the same as other samples. This SQUID was measured in the same manner. Measurement result is shown in Table 8 together.

TABLE 8

| Presence of the cover | | exist | none | none |
|---|---|---|---|---|
| Length of the hole pattern | (μm) | 200 | 200 | 160 |
| Effective mangetic flux capture area | (mm$^2$) | 0.1 | 0.08 | 0.07 |
| Output voltage "V$_{PP}$" | (μV) | 7.5 | 5 | 8 |

As shown in the Table 8, SQUID equipped the thin film cover has high effective magnetic flux capture area ($A_{eff}$) and high output voltage ($V_{pp}$).

By the way, the substantial length of the hole pattern becomes short, output voltage ($V_{pp}$) becomes higher. However, effective magnetic flux capture area ($A_{eff}$) becomes lower when the length is gone over certain value.

In particular, if effective magnetic flux capture area ($A_{eff}$) is sacrificed when big output voltage is necessary, output voltage ($V_{pp}$) becomes high.

Embodiment 5

In this embodiment, SQUID was equipped a superconducting thin film cover having different configuration from the embodiment 4.

Figure 8A:
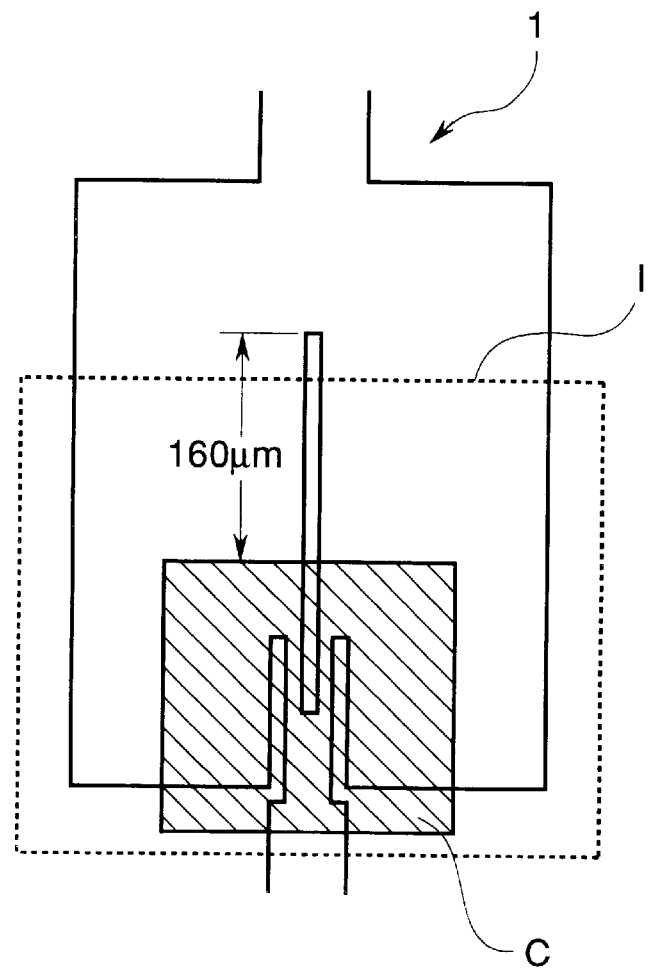
FIG. 8A is plan view that shows a superconducting thin film cover mounted on a SQUID.

In the embodiment 4, SQUID and superconducting thin film cover was formed on separate substrate each. In this embodiment, a SQUID and a superconducting thin film cover were both formed on one substrate. On the substrate which was mounted the SQUID 1, an isolating layer I having thickness of 2000 Å was formed in a domain shown in FIG. 8A by dotted line.

At first, the material of the isolating layer I was SrTiO$_3$ that is the same as the substrate. Next, a superconducting thin film as a thin film cover C was deposited on a domain shown in FIG. 8A by a slanted line. The superconducting thin film cover C has thickness of 3000 Å and was narrower than the isolating layer I. The size of superconducting thin film cover C was 1.5×1.5 mm.

Figure 8B:
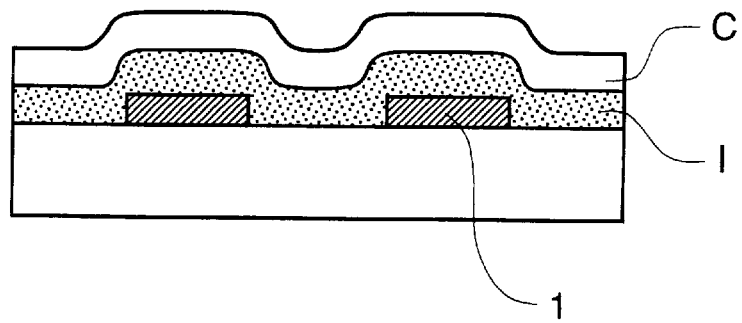
FIG. 8B is a sectional view that shows the same object as the FIG. 8A.

As a result, the substantial length of the hole pattern of the SQUID became 160 μm. The material of the superconducting thin film cover C was Y$_1$Ba$_2$Cu$_3$O$_{7-x}$ that is the same as the SQUID1. FIG. 8B shows the section of the superconducting thin film cover C. Concerning the SQUID with the superconducting thin film cover, an effective magnetic flux capture area ($A_{eff}$) and output voltage ($V_{pp}$) at 77 K were measured. The measurement result is shown in Table 9. The measurement result of SQUID without a superconducting thin film cover is also shown in Table 9.

TABLE 9

| Presence of the cover | | exist | none |
|---|---|---|---|
| Effective magnetic flux capture area | (mm$^2$) | 0.1 | 0.08 |
| Output voltage "V$_{PP}$" | (μV) | 7.5 | 5 |

As shown in the Table 9, efficiency of the thin film cover is substantially the same as the case of the embodiment 4.

Embodiment 6

A superconducting thin film cover having different configuration from the embodiment 4 and the embodiment 5 was equipped to a SQUID.

Figure 9A:
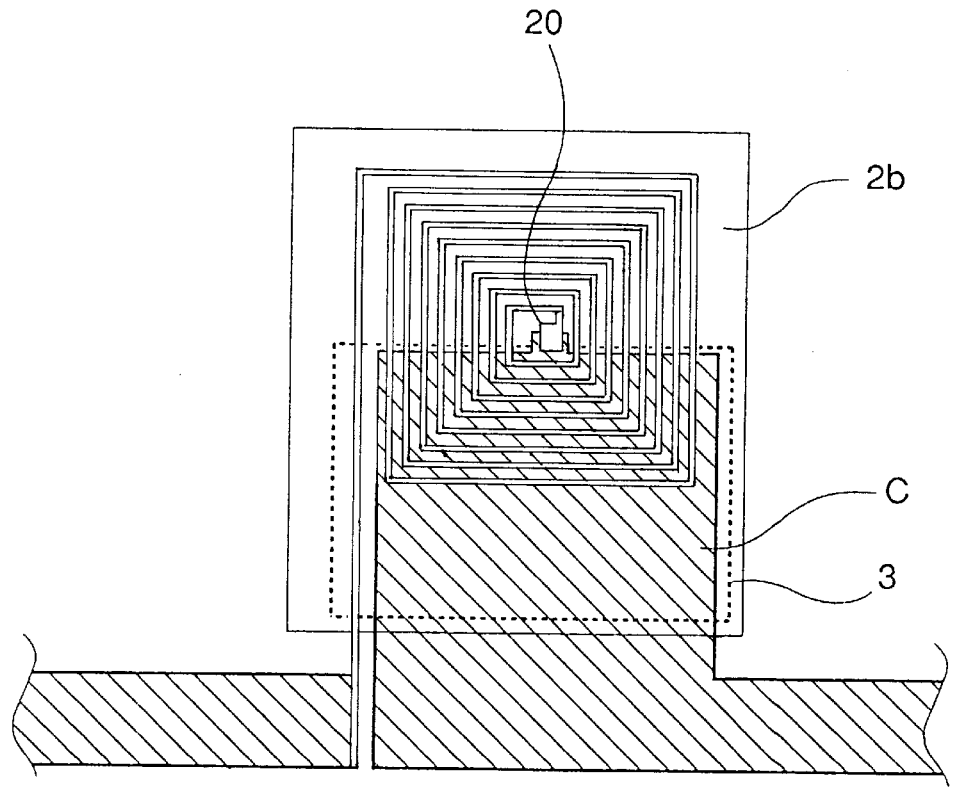
FIG. 9A and FIG. 9B are plan views that show both superconducting thin film cover and flux transformer mounted on the SQUID.
Figure 9B:
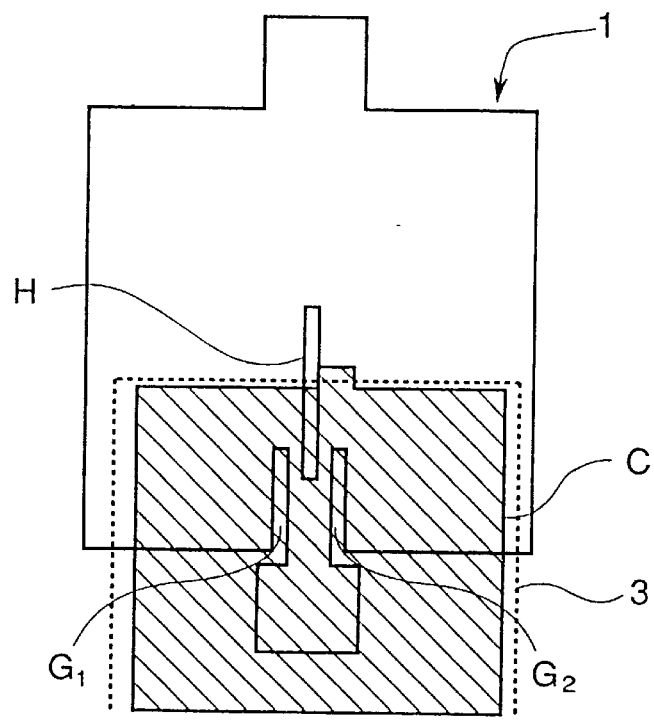

FIG. 9A shows characteristic part of magnetic sensor of this embodiment. Superconducting thin film C is deposited on the isolating layer 3 which is mounted on the input coil. In this magnetic sensor, superconducting thin film C serves as a superconducting thin film cover and a crossover of the flux transformer. As shown in FIG. 9B, the superconducting thin film C covers up the slit patterns G1, G2 whole and a part of the hole pattern H of the coupled SQUID which was produced in the embodiment 1 as a sample X.

Effective magnetic flux capture area ($A_{eff}$) and output voltage ($V_{pp}$) at 77 K of this magnetic sensor were measured. For comparing, a flux transformer having a crossover of usual width was prepared. A SQUID of equal dimensions was combined with this flux transformer as a sample Y. Effective magnetic flux capture area ($A_{eff}$) and output voltage ($V_{pp}$) at 77 K of these samples X, Y were measured in the same condition. Furthermore, for comparing, individual SQUID (without flux transformer) was prepared as a sample Z. The measurement result of each sample is shown in Table 10.

TABLE 10

| Sample Number | | X | Y | Z |
|---|---|---|---|---|
| Effective magnetic flux capture area | (mm$^2$) | 2.7 | 2.5 | 0.08 |
| Output voltage "V$_{PP}$" | (μV) | 8 | 6.5 | 5 |

As shown in the Table 10, the efficiency of the superconducting thin film cover was confirmed. In addition, the sample Y has superior characteristic to the sample Z, because the line of the input coil covers up a part of the slit pattern and the hole pattern.

Embodiment 7

Figure 10A:
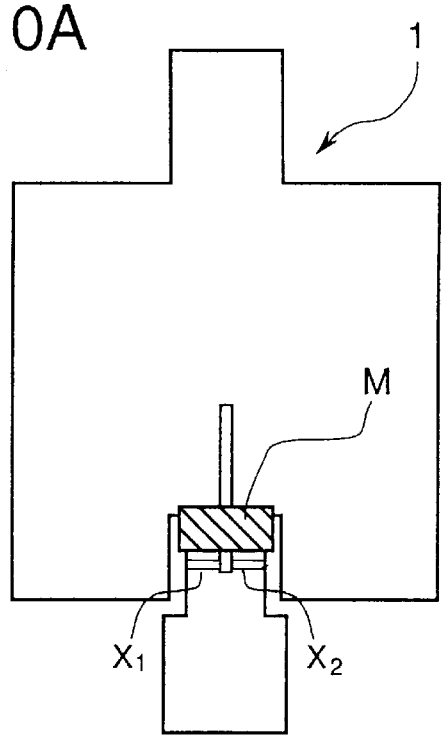
FIG. 10A and FIG. 10B are plan views and FIG. 10C is a sectional drawing that show a damping resistance equipped on the SQUID.

The SQUID having the same dimension was equipped with a damping resistance made of Mo. Ag thin film having thickness of 1000 Å and Au thin film having thickness of 1000 Å successively on a Y$_1$Ba$_2$Cu$_3$O$_{7-x}$ thin film to be a SQUID. The metal mask that opens a domain M shown in FIG. 10A was used.

Figure 10B:
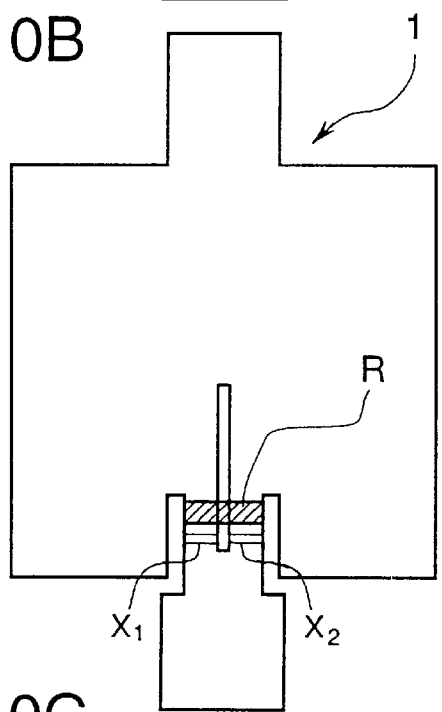

More concretely, at first, Ag thin film and Au thin film were deposited on a domain sufficiently wide. Next, when a Y$_1$Ba$_2$Cu$_3$O$_{7-x}$ thin film was patterned for forming a SQUID, unnecessary Ag thin film and Au thin film were removed. In successive step, Mo thin film was deposited on the Ag thin film and the Au thin film in a domain R as shown in the FIG. 10B. The method for patterning the Mo thin film was lift off method.

Figure 10C:
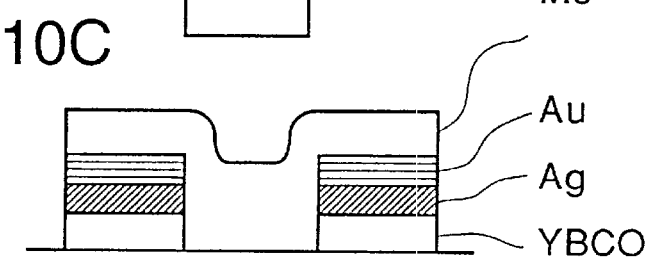

FIG. 10C shows a section view of the completed damping resistance. In this embodiment, the width of the Mo thin film was 10 μm and the thickness of the Mo thin film was 1000 Å. Concerning the SQUID with a damping resistance and a SQUID only (without a damping resistance), output voltage ($V_{pp}$) at 77 K was measured. Measurement result is shown in Table 11.

TABLE 11

| Damping resistance | | exist | none |
|---|---|---|---|
| Output voltage "V$_{PP}$" | (μV) | 7 | 5 |

As shown in the Table 11, output voltage ($V_{pp}$) of SQUID with damping resistance was higher.

It is not to say that other material, for example Nb, can be used as a material of the damping resistance.

Embodiment 8

Efficiency of a damping resistance and a superconducting thin film cover at the same time. The SQUID with the damping resistance of the embodiment 7 was equipped with the superconducting thin film cover of the embodiment 4. Effective magnetic flux capture area ($A_{eff}$) and output voltage ($V_{pp}$) at 77 K were measured. Dimensions and measurement result of each sample are shown in Table 12.

TABLE 12

| Presence of the cover | | none | exist | none | exist |
|---|---|---|---|---|---|
| Damping resistance | | none | none | exist | exist |
| Effective magnetic flux capture area | (mm²) | 0.08 | 0.1 | 0.08 | 0.1 |
| Output voltage "$V_{PP}$" | (μV) | 5 | 7.5 | 7 | 9.5 |

As shown in Table 12, effective magnetic flux capture area ($A_{eff}$) and output voltage ($V_{pp}$) are superior in the magnetic sensor which is equipped with both a superconducting thin film cover and a damping resistance.

Embodiment 9

Performance of magnetic sensor mounted with the flux transformer of the embodiment 3 in SQUID of the embodiment 4 that comprises the superconducting thin film cover was examined. Effective magnetic flux capture area ($A_{eff}$) and output voltage ($V_{pp}$) at 77 K were measured. Dimensions and measurement result of each sample are shown in Table 13.

TABLE 13

| Presence of the cover | | none | exist | none | exist |
|---|---|---|---|---|---|
| Damping resistance | | none | none | exist | exist |
| Effective magnetic flux capture area | (mm²) | 0.08 | 0.08 | 2.5 | 2.5 |
| Output voltage "$V_{PP}$" | (μV) | 5 | 7 | 6.5 | 8.5 |

As shown in Table 12, effective magnetic flux capture area ($A_{eff}$) and output voltage ($V_{pp}$) are superior in the magnetic sensor which is equipped with both a superconducting thin film cover and a damping resistance.

In addition, output voltage becomes higher when only flux transformer was equipped, because the superconducting thin film which is a line of the input coil goes across the hole pattern and the slit pattern of the SQUID.

Embodiment 10

Performance of a magnetic sensor mounted with the damping resistance of the embodiment 7 in the SQUID of the embodiment 6 that was equipped the flux transformer. Output voltage ($V_{pp}$) at 77 K was measured. Measurement result of each sample is shown in Table 14.

TABLE 14

| Damping resistance | | exist | none |
|---|---|---|---|
| Output voltage "$V_{PP}$" | (μV) | 8 | 10 |

As shown in Table 14, all addition products appeared preferable effect.

Embodiment 11

SQUID which dimension of washer pattern was 15 mm sq. was prepared as a sample A. Other dimensions of the sample A was the same as the SQUID of the embodiment 1 at all.

A $Y_1Ba_2Cu_3O_{7-x}$ thin film having size of 3 mm×8 mm was prepared as a superconducting thin film cover. This thin film cover was mounted on the SQUID having the same dimension as the sample A by the same method as the embodiment 7. This SQUID with the thin film cover was prepared as a sample B.

The damping resistance having the same dimension as the embodiment 7 was added to the SQUID having the same dimensions as the sample A by the same method as the embodiment 7. This SQUID with the damping resistance was prepared as a sample C.

The superconducting thin film cover having the same dimensions as the sample B and the damping resistance having the same dimension as the sample C were added to the SQUID having the same dimensions as the sample A. This SQUID with the superconducting thin film cover and the damping resistance was prepared as a sample D.

Effective magnetic flux capture area ($A_{eff}$) and output voltage ($V_{pp}$) at 77 K were measured. Measurement result of each sample is shown in Table 15.

TABLE 15

| Sample | | A | B | C | D |
|---|---|---|---|---|---|
| Presence of the cover | | none | exist | none | exist |
| Damping resistance | | none | none | exist | exist |
| Effective magnetic flux capture area | (mm²) | 0.6 | 0.75 | 0.6 | 0.75 |
| Output voltage "$V_{PP}$" | (μV) | 5 | 7.5 | 7 | 9.5 |

As shown in the Table 15, when an outer diameter of washer pattern becomes large, the magnetic flux capture area becomes large. As shown in measurement result of sample B, C and D, each addition products appeared preferable effect.

We claim:

1. A magnetic sensor comprises a SQUID made of a superconducting thin film including a washer pattern having a hole pattern, an artificial grain boundary, a pair of openings and a pair of terminal portions, characterized in that:

the hole pattern has a non-square rectangle shape and includes the center of the washer pattern;

the terminal portions each grow from the facing outside edges of the washer pattern toward outside;

the openings that have a straight shape and are parallel to the long side of the hole pattern do not reach to the hole and grow toward inside the washer pattern from the outside edge that is nearest to the hole pattern so that the openings overlap the hole pattern; and the artificial grain boundary is formed only in a plane of the washer pattern, said artificial grain boundary coinciding with a longitudinal direction of the openings and being in a direction perpendicular to a domain that the spacing of the hole pattern and the opening pattern is narrowest, said artificial grain boundary being absent elsewhere on the washer pattern.

2. A magnetic sensor according to claim 1, wherein said SQUID is made of an oxide superconducting thin film deposited on a substrate having step and including a weak link made of an artificial grain boundary at the step.

3. A magnetic sensor according to claim 1, wherein the long side of the hole pattern has 5 times length as the short side of the hole pattern.

4. A magnetic sensor according to claim 1, wherein the size of the washer pattern is not less than 10 mm sq. and is not more than 200 mm sq.

5. A magnetic sensor according to claim 1, wherein a superconducting thin film cover covering the slit patterns and a part of the hole pattern is mounted on the SQUID.

6. A magnetic sensor according to claim 1 wherein the SQUID is equipped with a flux transformer.

7. A magnetic sensor according to claim 6, wherein the SQUID is equipped with a flux transformer comprising an input coil, a pickup coil and a connection line and the connection line covers the slit patterns and a part of the hole pattern of the washer pattern.

8. A magnetic sensor according to claim 1, wherein the SQUID is equipped with a damping resistance that is put together 2 points on the SQUID and in parallel to the inductance of the SQUID.

9. A magnetic sensor according to claim 8, wherein the damping resistance is made of a metal thin film that is deposited on a thin film comprising Au, Ag or a mixture thereof deposited on the superconducting thin film.

10. A magnetic sensor according to claim 2, characterized in that the superconducting thin film is $Y_1Ba_2Cu_3O_{7-x}$.

* * * * *